United States Patent
Fuchs et al.

(10) Patent No.: US 7,132,969 B2
(45) Date of Patent: Nov. 7, 2006

(54) CONFIGURATION FOR DIGITAL-ANALOG CONVERSION OF HIGH-FREQUENCY DIGITAL INPUT SIGNAL INTO CARRIER-FREQUENCY ANALOG OUTPUT SIGNAL

(75) Inventors: Armin Fuchs, Deggingen (DE); Björn Jelonnek, Ulm (DE); Gunter Wolff, Ulm (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/525,083

(22) PCT Filed: Jul. 28, 2003

(86) PCT No.: PCT/EP03/08323

§ 371 (c)(1),
(2), (4) Date: Feb. 18, 2005

(87) PCT Pub. No.: WO2004/023658

PCT Pub. Date: Mar. 18, 2004

(65) Prior Publication Data

US 2006/0164275 A1 Jul. 27, 2006

(30) Foreign Application Priority Data

Aug. 19, 2002 (DE) .................. 102 37 856
Aug. 19, 2002 (EP) .................. 02018602

(51) Int. Cl.
*H03M 1/66* (2006.01)
(52) U.S. Cl. ..................................... 341/144
(58) Field of Classification Search ................. 341/126, 341/144, 150, 152, 153; 331/32, 36 R, 36; 375/229, 230
See application file for complete search history.

(56) References Cited

U.S. PATENT DOCUMENTS

| | | | | |
|---|---|---|---|---|
| 4,626,803 A | * | 12/1986 | Holm | 332/151 |
| 5,008,674 A | * | 4/1991 | Da Franca et al. | 341/150 |
| 5,323,157 A | | 6/1994 | Ledzius et al. | |
| 5,521,946 A | * | 5/1996 | Main | 375/350 |
| 5,625,360 A | | 4/1997 | Garrity et al. | |
| 6,816,097 B1 | * | 11/2004 | Brooks et al. | 341/143 |

FOREIGN PATENT DOCUMENTS

EP 0 344 998 12/1989

OTHER PUBLICATIONS

English Abstract for Japanese Published Patent Application 5-145423 published Jun. 11, 1993.
C. Jansson et al., "A 1-MHZ and 16-Bit ΣΔ DAC with a 224th-Order Reconstruction FIR-Filter Using only 9 Nonzero Taps", ASIC Conference and Exhibit, Sep. 19, 1994, pp. 29-32.

* cited by examiner

*Primary Examiner*—Brian Young
(74) *Attorney, Agent, or Firm*—Staas & Halsey LLP

(57) ABSTRACT

A delay device has at least one first delay element and optional additional delay elements connected downstream from the first in a serially consecutive manner. The digital input signal is connected to an input of the first delay element and is connected to an input of a first D/A converter. The output of the first delay element is connected to an input of another D/A converter assigned thereto. The optional additional delay elements each have outputs connected to an input of another D/A converter assigned to the respective delay elements. All D/A converters are combined on the output side in a step-by-step manner so that output signals of all D/A converters form the analog output signal or the device. A specific coefficient is assigned to each D/A converter, and a specific delay time is assigned to each delay element for realizing a filter characteristic.

7 Claims, 2 Drawing Sheets

CONFIGURATION FOR DIGITAL-ANALOG CONVERSION OF HIGH-FREQUENCY DIGITAL INPUT SIGNAL INTO CARRIER-FREQUENCY ANALOG OUTPUT SIGNAL

CROSS REFERENCE TO RELATED APPLICATIONS

This application is a 371 of PCT/EP03/08323 filed Jul. 28, 2003.

This application is based on and hereby claims priority to German Application No. 102 27 856.8 filed on 19 Aug. 2002 and European Application No. 02018602.9 filed on 19 Aug. 2002, the contents of which are hereby incorporated by reference.

BACKGROUND OF THE INVENTION

1. Field of the Invention

The invention relates to a configuration for the digital-analog conversion of a high-frequency digital input signal into a carrier-frequency analog output signal.

2. Description of the Related Art

Architectures for the generation of a broadband, carrier-frequency output signal are known in which, in a low frequency range, a digital input signal is converted into an analog signal using a digital-analog converter, and then reconverted into the carrier-frequency output signal using one or more mixing stages.

Furthermore, digital-analog converter architectures are known in which a carrier-frequency output signal is generated from a high-frequency digital input signal without further frequency conversion. The carrier-frequency analog output signal in this case also has unwanted carrier frequencies in addition to a desired carrier frequency. These unwanted carrier frequencies can be caused, for example, by a less than perfect digital input signal or by various unwanted modulation mechanisms.

In the described architectures, cost-intensive filters with high quality or mixers with high linearity, which are always configured on the output end and which must be adjusted to a required carrier frequency range in each case, are necessary. These must be replaced, at great expense, if a change in carrier frequency range is required.

SUMMARY OF THE INVENTION

An object of this invention is therefore to design a configuration for digital-analog conversion in such a way that it can be adjusted to various carrier frequency ranges without great cost.

A configuration for digital-analog conversion according to one aspect of the invention has an integrated filter characteristic, thus eliminating the need for cost-intensive mixers or filters at the output end. D/A converters are connected parallel to one another and specific coefficients are assigned to each of the individual D/A converters. This enables the configuration to be ideally adjusted to a required carrier frequency range.

A configuration according to the invention can be adjusted to different carrier frequency ranges by modifying the clock frequency of the D/A converters accordingly.

According to the invention, it is particularly preferable for a Finite Impulse Response (FIR) filter characteristic to be realized and/or integrated into the configuration through the selection of the coefficients that are specifically assigned to the D/A converters and of the delay times that are specifically assigned to the delay elements. The consecutive coefficients correspond to a sampling of an impulse response from a filter that has a required filter characteristic. In this way the carrier-frequency output signal has a higher spectral purity compared to a form implemented without filter characteristic.

The FIR filter characteristic integrated according to the invention is scalable using a clock frequency of a clock signal. This may be derived from or identical to the clock frequency of the A/D converters. Since the clock frequency usually varies in proportion to the carrier frequency, the filter characteristic is automatically adjusted in this invention.

If there is a change in the required carrier frequency range, the FIR filter characteristic is reset accordingly via the clock frequency. There is no replacement of hardware components.

If the accuracy and the number of the FIR filter coefficients correspond to the requirements of a new mobile radio standard, then it is possible to switch frequency range directly via the clock frequency, in which case software might be used to implement the switch.

A configuration according to the invention enables expenditure on filters to be considerably reduced, for any carrier frequency range, by prefiltering. Together with a corresponding power output stage, the elimination of the need for frequency-specific filtering at the transmitter end makes for high quality.

In particular, quantization noise formed by $\Sigma\Delta$ converters on the input signal can easily be suppressed by using a configuration according to the invention.

The filter function of a configuration according to the invention can be influenced by the signal form emitted by each D/A converter per datum or bit. By using a suitable signal form, such as—for example—multiple pulses, which consist of several pulses for each datum, the filter function can be improved selectively.

BRIEF DESCRIPTION OF THE DRAWINGS

These and other objects and advantages of the present invention will become more apparent and more readily appreciated from the following description of an exemplary embodiment, taken in conjunction with the accompanying drawings of which.

DETAILED DESCRIPTION OF THE PREFERRED EMBODIMENT

Figure 1:
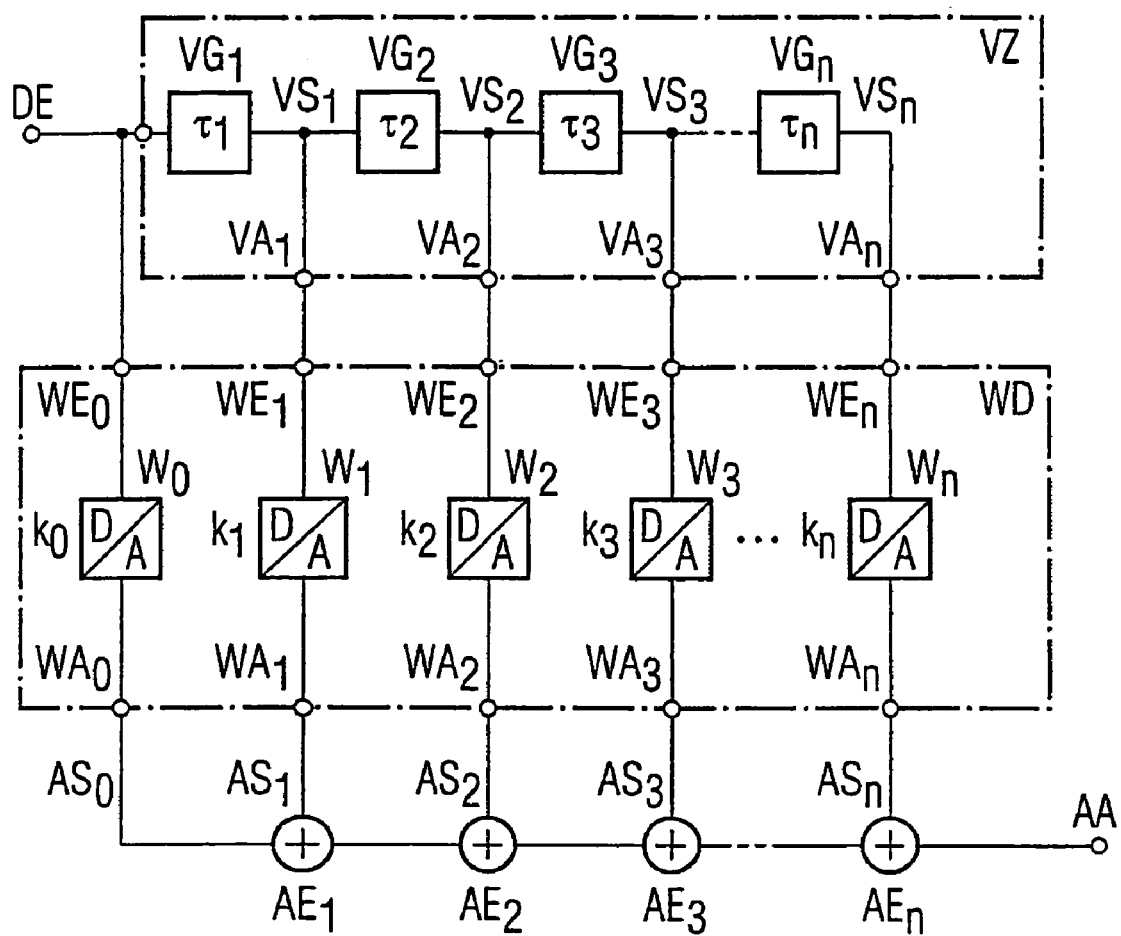
FIG. 1 is a block diagram of a configuration for digital-analog conversion according to the invention, and FIG. 2, by way of comparison with FIG. 1, is a block diagram of an exemplary embodiment of a configuration for digital-analog conversion according to the invention.

Reference will now be made in detail to the preferred embodiments of the present invention, examples of which are illustrated in the accompanying drawings, wherein like reference numerals refer to like elements throughout.

FIG. 1 shows a block diagram of a configuration for digital-analog conversion according to the invention.

A high-frequency digital input signal DE arrives at a delay device VZ and at a converter device WD.

The delay device VZ has n delay elements VG1, VG2, VG3, ..., VGn, which are connected in a serially consecutive manner, and with a specific delay time $\tau 1, \tau 2, \tau 3, \ldots, \tau n$ being assigned to each of them. Each individual delay element VG1 to VGn is connected on the output side to an output VA1, VA2, VA3, . . . , VAn of the delay device VZ. Via each of these outputs VA1 to VAn, a delay signal VS1, VS2, VS3, . . . , VSn, assigned thereto in each case and formed by the corresponding delay element VG1 to VGn, reaches an input WE1, WE2, WE3, . . . , WEn on the conversion device WD.

The conversion device WD has a total of n+1 D/A converters W0, WI, . . . , Wn, which are arranged in parallel to one another. A first D/A converter W0 receives the digital input signal DE, as the input signal, via an input WE0 on the conversion device WD. The other n D/A converters receive the delay signals VS1 to VSn, as input signals, via correspondingly assigned inputs WE1 to WEn.

A specific coefficient k0, kl, . . . , kn is assigned to each of the individual n+1 D/A converters WE0 to WEn of the conversion device WD.

The individual D/A converters W0 to Wn are combined on the output side, for example using n adding devices AE1, AE2, . . . , AEn. Using the adding devices AE1 to AEn, n+1 output signals AS0, AS1, . . . , ASn of the n+1 D/A converters are added together to form a carrier-frequency analog output signal AA.

It should be noted that the digital input signals DE and VS1 to VSn are weighted, during the D/A conversion in the corresponding D/A converters W0 to Wn, with the respectively assigned coefficients k0 to kn.

These coefficients k0 to kn of the D/A converters W0 to Wn and the delay times $\tau 1$ to $\tau n$ of the delay elements VG1 to VGn are defined such that a configuration for digital-analog conversion according to the invention has a required FIR filter characteristic.

Figure 2:
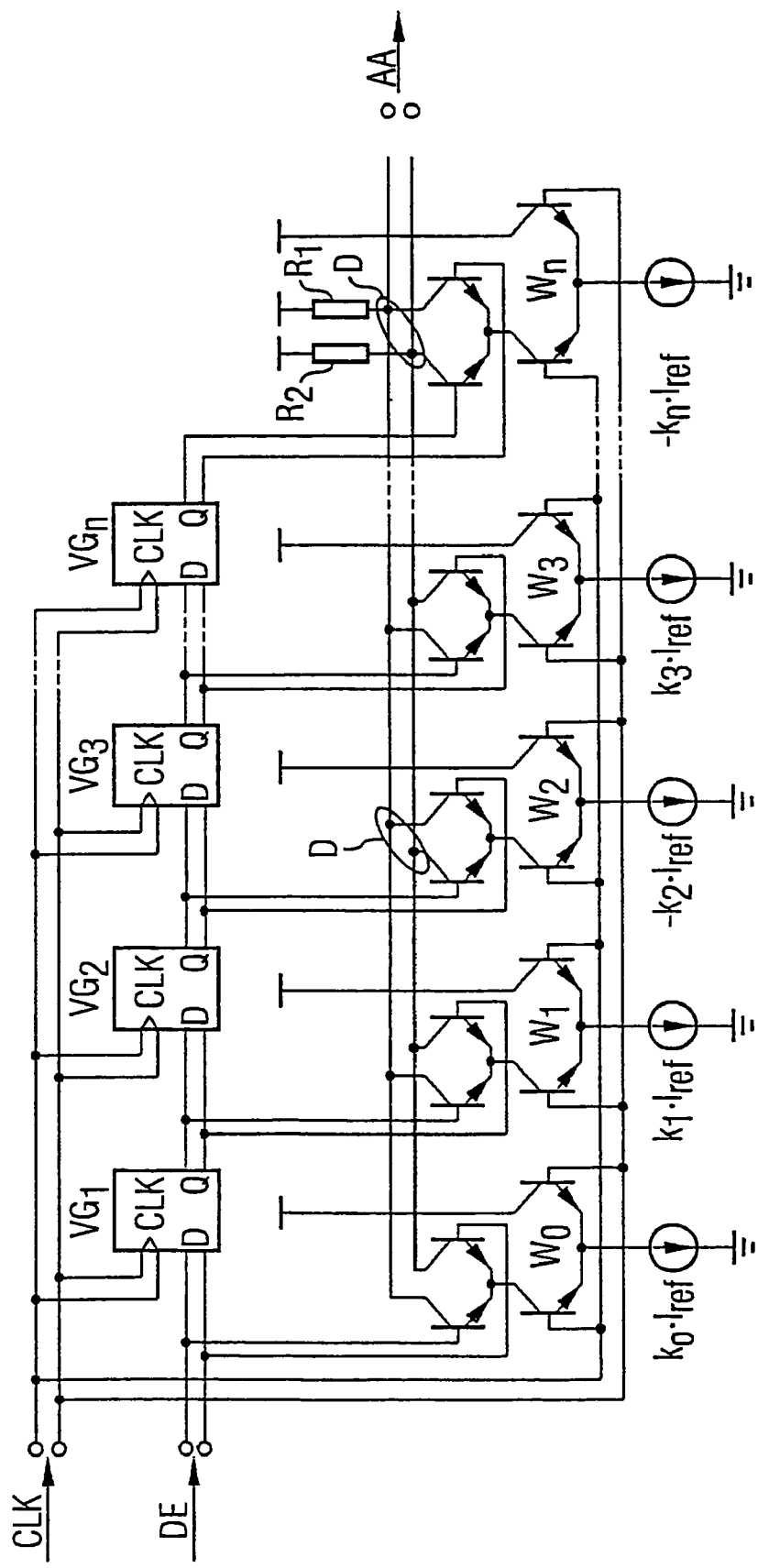

FIG. 2, by way of comparison with FIG. 1, shows an exemplary embodiment of a configuration for digital-analog conversion according to the invention.

The individual D/A converters W0 to Wn are implemented as I-bit D/A converters and the delay elements VG1 to VGn as D latches. Both the D/A converters W0 to Wn and the delay elements VG1 to VGn are timed with a clock signal CLK.

The digital input signal DE is connected to the D input of a first D latch or of a first delay element VG1. On the output side, the first delay element VG1 is connected via its Q output to a D input of the next delay element VG2, etc.

Because of the clock signal CLK, the specific delay times $\tau 1$ to $\tau n$ assigned to the individual delay elements VG1 to VGn correspond, as illustrated here, to half of a clock period of the clock signal CLK, which is likewise applied to the D/A converters W0 to Wn. Each individual delay element or D latch effects a delay of half of a clock period.

However, smaller sections of the clock period of the clock signal CLK may be used for the delay elements VG1 to VGn. This facilitates a more precise adjustment to an impulse response of a required filter characteristic. This in turn multiplies the Nyquist frequency of the filter characteristic and suppresses the alias effect.

The coefficients k0 to kn assigned to the individual D/A converters W0 to Wn are set with the help of reference current sources ki*lref (in which i=0 to n), which determine the amplitude of the output signals AS0 to ASn.

If negative factors are required in the coefficients k0 to kn in order to realize the FIR filter characteristic, then corresponding outputs are exchanged in the D/A converters affected.

This is shown, by way of example, for the coefficients k2 and kn. The connections for the outputs are exchanged in the corresponding D/A converters W2 and Wn compared to the D/A converter WI (see detail D).

The output signals AS0 to ASn in the D/A converters W0 to Wn are added together at the same time and form the analog output signal AA.

The high-frequency digital input signal DE can also be in the form of a broadband signal in this invention.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

The invention claimed is:

1. A configuration for digital-analog conversion of a high-frequency digital input signal into a carrier-frequency analog output signal, comprising:
    a delay device having at least one delay element, each delay element having an input and an output, the input of a first delay element receiving the high-frequency digital input signal and any additional delay elements connected downstream from the first delay element in a serially consecutive manner;
    a first D/A converter having an input receiving the high-frequency digital input signal; and
    at least one subsequent D/A converter, each having an input connected to the output of a corresponding delay element, all D/A converters controlled with an identical clock signal and having outputs with a multiple pulse sequence combined in a step-by-step manner to form the analog output signal, where a filter characteristic is realized by assigning specific coefficients to the first and at least one subsequent D/A converters, respectively, and a specific delay time to each delay element, for a total delay time corresponding to at least part of a clock period of the identical clock signal such that the filter characteristic is automatically adjusted if there is a change in carrier frequency range of the output signal, thereby improving filter function.

2. A configuration according to claim 1, wherein the specific coefficients and the specific delay time of each delay element are selected to realize a Finite Impulse Response filter characteristic.

3. A configuration according to claim 2, wherein each delay element is configured as a D latch timed with the identical clock signal.

4. A configuration according to claim 3, wherein all D/A converters are configured as I-bit D/A converters.

5. A configuration according to claim 4, further comprising adding devices connected to the outputs of all D/A converters for combining thereof.

6. A configuration according to claim 5, wherein the specific delay time assigned to each delay element is identical.

7. A configuration according to claim 6, wherein the high-frequency digital input signal is broadband.

* * * * *